(12) United States Patent
Osborn (10) Patent No.: US 6,505,330 B1
(45) Date of Patent: Jan. 7, 2003

(54) METHOD AND APPARATUS FOR DESIGNING TRACE LENGTHS OF A CLOCKED BUS OF A MOUNTING SURFACE

(75) Inventor: Daniel D Osborn, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 199 days.

(21) Appl. No.: 09/617,385

(22) Filed: Jul. 17, 2000

Related U.S. Application Data (63) Continuation-in-part of application No. 09/458,375, filed on Dec. 10, 1999, now Pat. No. 6,418,552.

(51) Int. Cl.[7] .............................................. G06F 17/50
(52) U.S. Cl. .................................. 716/8; 716/9; 716/10
(58) Field of Search ................................ 716/8–15, 18, 716/4–6

(56) References Cited

U.S. PATENT DOCUMENTS 5,638,291 A * 6/1997 Li et al. ....................... 716/18
6,080,206 A * 6/2000 Tadokoro et al. ............. 716/10

* cited by examiner

Primary Examiner—Vuthe Siek
Assistant Examiner—Naum B Levin (57) ABSTRACT

The present invention provides a method and an apparatus that are utilized to enable the range of trace lengths of the bus of a mounting surface, such as a PCB, for example, to be maximized without violating setup and/or hold times. The method of the present invention utilizes information relating to certain timing parameters of the ICs and the package delays of the ICs to maximize the range of trace lengths of the PCB bus as a function of a selected clock offset. A clock offset is inserted into the global clock of the PCB bus and minimum and maximum PCB bus trace lengths are calculated as a function of the clock offset, The apparatus of the present invention is a computer that performs the calculations needed to perform the method of the present invention. For example, the computer receives the information relating to the timing parameters and the package delays of the ICs and processes the information to determine the minimum and maximum trace lengths for each signal of the ICs. The computer then adjusts the clock offset to maximize the difference between the minimum and maximum trace lengths. The routing and lengths of the traces are then adjusted, if necessary, to ensure that the setup and hold time specifications of the ICs are not violated.

24 Claims, 6 Drawing Sheets

METHOD AND APPARATUS FOR DESIGNING TRACE LENGTHS OF A CLOCKED BUS OF A MOUNTING SURFACE

CROSS-REFERENCE TO RELATED APPLICATION

This application is a continuation-in-part application to U.S. patent application Ser. No. 09/458,375, filed Dec. 10, 1999 now U.S. Pat. No. 6,418,552 entitled "A METHOD AND APPARATUS FOR OPTIMIZING TRACE LENGTHS TO MAXIMIZE THE SPEED OF A CLOCKED BUS".

TECHNICAL FIELD OF THE INVENTION

The present invention relates to printed circuit board (PCB) design and, more particularly, to a method and apparatus for determining an optimum clock offset of the PCB bus clock to thereby maximize the permissible range of bus trace lengths in cases where external factors limit the maximum speed of the bus.

BACKGROUND OF THE INVENTION

A typical PCB comprises several electrical components, such as, for example, microprocessors, memory elements and interface components, which communicate with each other via a globally clocked bus of the PCB. When integrated circuits (ICs) are designed, the IC designer sometimes increases the lengths of certain traces, or routes, from the pads of the die of the IC to the pins of the IC in order to equalize the lengths of the traces. The traces are conductive paths that comprise the bus of the IC package. Increasing certain trace lengths ensures that the signals traveling on the traces require the same amount of time to travel from the die to their respective pins, and vice versa.

When the PCB designer designs the PCB, the PCB designer sometimes increases the lengths of certain traces of the PCB bus in order to provide all of the traces of the PCB bus with equal lengths. However, the PCB and the IC design processes are performed independent of one another. Although the PCB designer typically utilizes the timing specifications of the IC packages in designing the PCB, these specifications normally do not provide information regarding the individual trace lengths within the IC package. Therefore, the PCB designer typically adds trace lengths to the PCB bus without having knowledge about the individual trace lengths of the IC package, which may not result in the best overall optimization of the PCB bus, but will result in more work for the PCB designer.

Figure 1A:
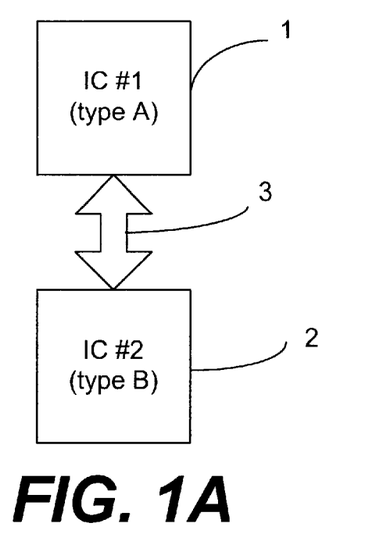
FIG. 1A is a block diagram of two different ICs that are in communication with each other via a bus of a printed circuit board (PCB).
Figure 1B:
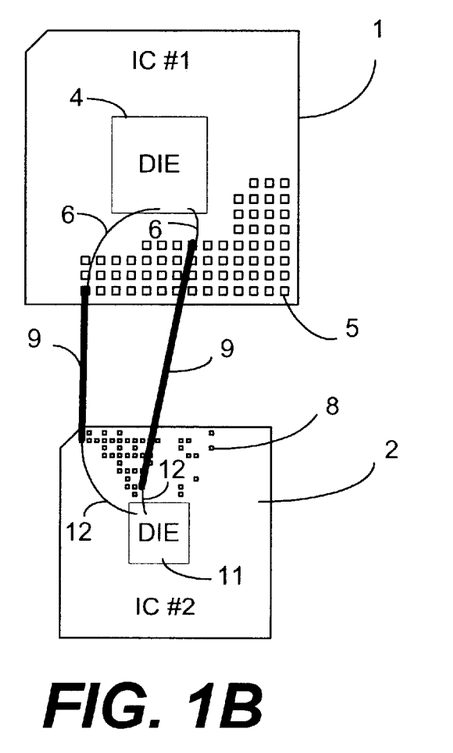
FIG. 1B is a more detailed illustration of the arrangement shown in FIG. 1A, which illustrates the bus traces of the ICs and of the PCB bus.

FIG. 1A is a block diagram of two different ICs 1 and 2 that are located on a PCB (not shown) and that communicate with each other via a PCB bus 3. The bus 3 is a globally clocked bus. The ICs 1 and 2 are "different" in that they at least have different timing parameters (e.g., setup and hold times, clock-to-Q, etc.). FIG. 1B is a more detailed illustration of the ICs 1 and 2 and the PCB bus 3 shown in FIG. 1A. IC 1 has a die 4 and each signal is routed from a particular location on the die 4 to one of the pins 5. The signals are routed by traces 6 that connect the particular locations on the die to respective pins 5. The locations at which the traces or wire bonds are connected on the die 4 typically correspond to bus drivers (not shown). The pins 5 on IC 1 are connected to IC 2 at respective pins 8 of IC 2 via traces 9 of the PCB bus 3. The pins 8 are connected to particular locations on the die 11 of IC 2 by traces 12 of the IC 2.

As stated above, the PCB board designer typically does not utilize information relating to the lengths of the traces 6 and 12 of the ICs 1 and 2, respectively. Therefore, adding trace lengths to the PCB bus traces 9 in order to equalize the lengths of the traces 9 may not result in optimization of the PCB bus 3 because doing so will not necessarily equalize the pad-to-pad trace lengths (i.e., the routing distances between the locations on the die 4 at which the traces 6 are connected and the locations on the die 11 at which the traces 12 are connected).

It would be desirable to provide a method for designing a PCB that takes into account the effects of the trace lengths within the IC packages and the timing parameters of the IC packages (e.g., setup-and-hold time, clocked Q, etc.) in determining the trace lengths of the PCB bus. In cases where the speed of the PCB bus is limited by external factors, the speed of the PCB bus cannot be increased by optimizing the trace lengths of the PCB bus. In fact, increasing or decreasing a trace length by a particular amount may result in violating the setup and/or hold times of an IC. It would be desirable to provide a technique that would enable the range of the PCB bus trace lengths to be maximized without violating the setup and/or hold times.

Accordingly, a need exists for a method and apparatus for maximizing the range of trace lengths of the PCB bus without violating the setup and/or hold times of ICs communicating over the PCB bus.

SUMMARY OF THE INVENTION

The present invention provides a method and apparatus that enables the range of trace lengths of the bus of a mounting surface, such as a PCB, for example, to be maximized without violating setup and/or hold times. The method of the present invention utilizes information relating to certain timing parameters of the ICs and the package delays of the ICs to maximize the range of trace lengths of the PCB bus as a function of a selected clock offset. The clock offset is inserted into the global clock of the PCB bus to maximize the range of the PCB bus trace lengths. The apparatus of the present invention is a computer that performs the calculations needed to perform the method of the present invention. For example, the computer receives the information relating to the timing parameters and the package delays of the ICs and processes the information to determine the minimum and maximum trace lengths for each signal of the ICs. The computer then determines a clock offset that maximizes the difference between the minimum and maximum trace lengths.

The determinations that are made by the computer may instead be made by a human, as will be understood by those skilled in the art. However, it is desirable to use a computer for this purpose since calculations need to be performed for many signals. Once these determinations have been made, the packages are positioned and the signals routed so that the trace lengths fall between the minimum and maximum trace lengths. If necessary, the clock offset is adjusted so that none of the signals violate the setup time specification (maximum length) and the least number of signals violate the hold time specification (minimum length). If the hold time specification is violated, the trace length(s) associated with the signal(s) that violate the hold time specification will be lengthened to prevent the hold time specification from being violated.

Other features and advantages of the present invention will become apparent from the following description, drawings and claims.

DETAILED DESCRIPTION OF THE INVENTION

Figure 2:
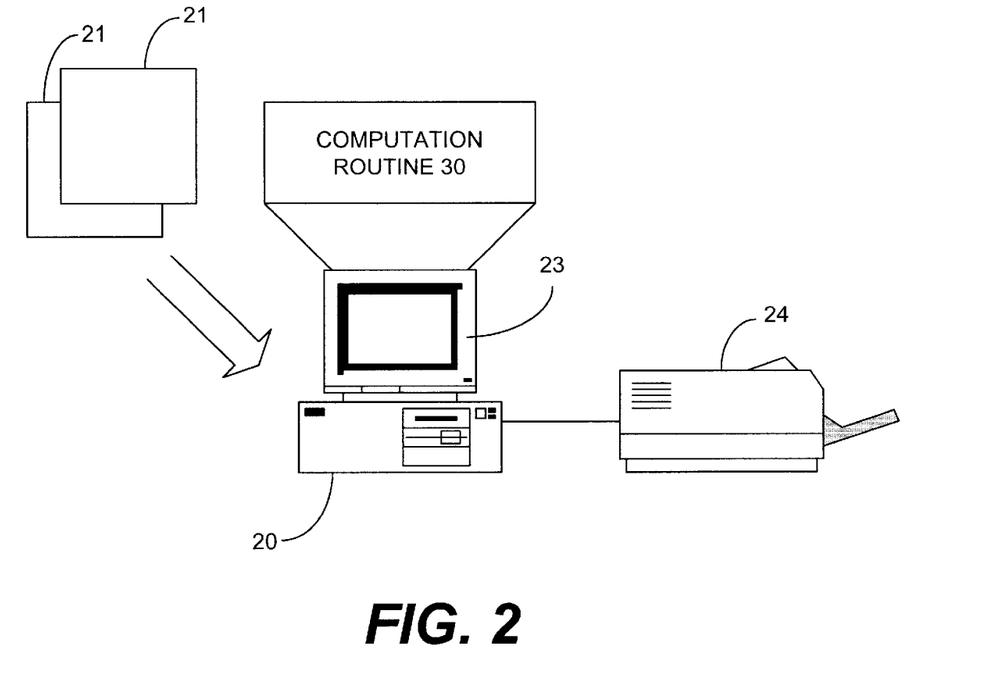
FIG. 2 is an illustration of the apparatus of the present invention in accordance with the preferred embodiment.

FIG. 2 illustrates the apparatus of the present invention in accordance with the preferred embodiment. The apparatus of the present invention comprises a computer 20, which receives one or more files 21 that contain information relating to the individual package trace lengths (i.e., die-to-pin trace lengths) and the timing parameters of two or more ICs that are to be mounted on a mounting surface such as, for example, a printed circuit board (PCB). The timing parameters preferably are the setup and hold times of the ICs and the clock-to-Q parameter, and possibly other timing parameters. The computer 20 utilizes this information and performs various computations to make various determinations that ultimately result in a determination as to the maximum and minimum PCB bus trace lengths that will not result in a violation of the setup and hold time specifications of the ICs.

The computer 20 may be in communication with a display device 23 that displays the results of the computations to enable a PCB designer (not shown) to utilize the results to mount the ICs at the appropriate locations on the PCB and to appropriately route the traces of the PCB bus. The computer 20 may also be in communication with a printer 24 to enable the PCB designer to print out the results. The computer 20 performs the aforementioned tasks by executing software, namely, a computation routine 30, which utilizes the package delays of the ICs for all signals and the aforementioned timing parameters to make the calculations to ensure that violations of the setup and hold time specifications of the ICs will not occur. The manner in which the computer 20 performs these tasks will be discussed below in detail with reference to the flow charts of FIGS. 3 and 7.

However, it should be noted that it is not necessary for the method of the present invention to be performed by a computer. The method of the present invention and the associated calculations may also be performed by a human being. However, due to the large number of calculations that must be performed, the method of the present invention preferably is performed with the aid of a computer. It should also be noted that the method of the present invention could be performed in part by the computer 20 and in part by a human being, such as the PCB designer.

Figure 3:
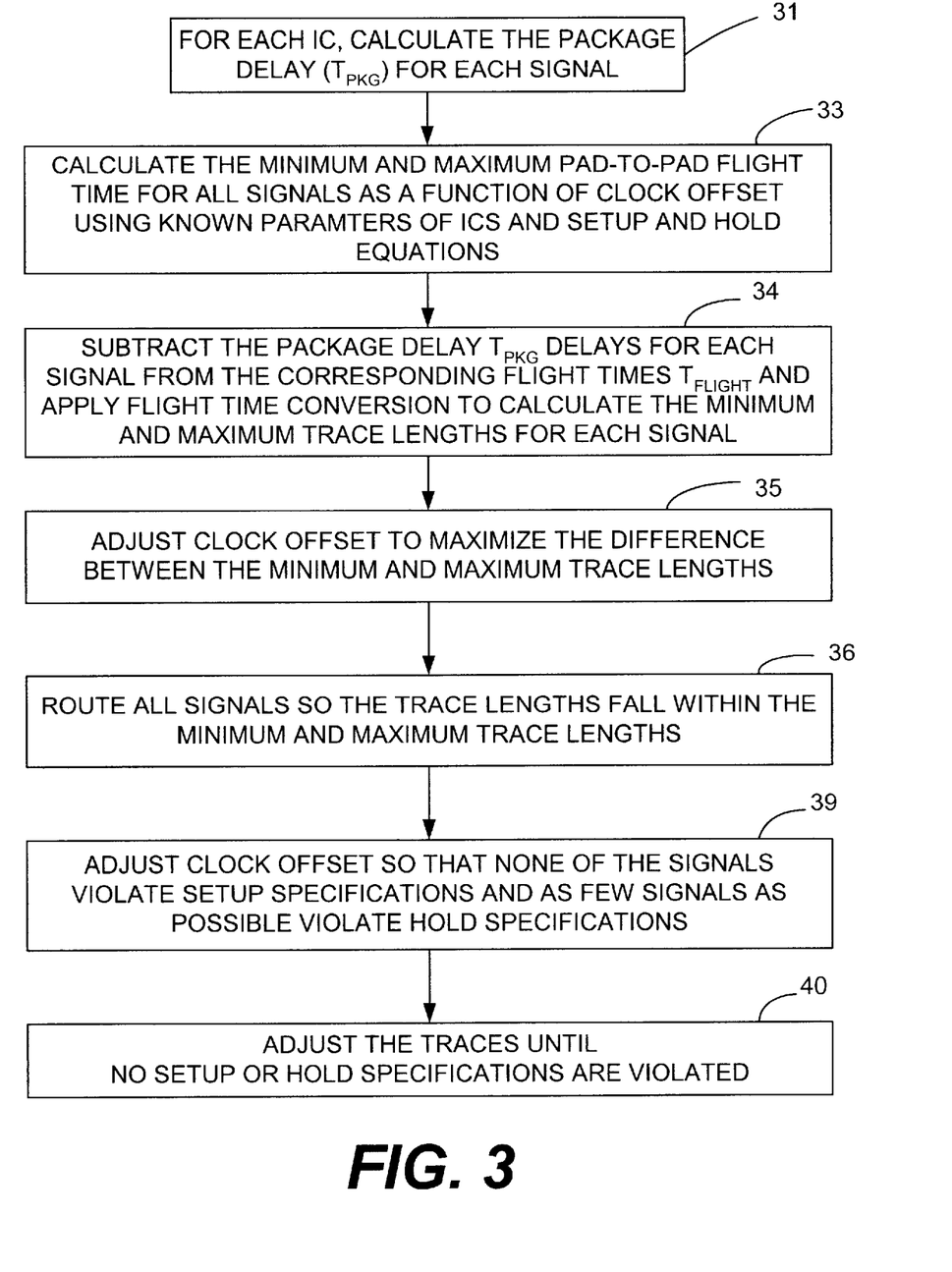
FIG. 3 is a flow chart illustrating the method of the present invention in accordance with a first embodiment.

The flow chart shown in FIG. 3 represents the functionality of a software program 30 that performs the method of the present invention. The software program 30 preferably utilizes information generated by the PCB designer who uses a computer aided design (CAD) program to design the PCB. To demonstrate the principles and concepts of the present invention, it is assumed that the speed of the PCB bus is fixed due to external factors. It is also assumed that a suitable clock offset has already been selected for insertion into the global clock of the PCB bus that maximizes the difference between the possible minimum and maximum trace lengths. Therefore, in accordance with the methods of the present invention, it is assumed that a clock offset has already been selected and calculations are performed that take the clock offset into account to determine the possible minimum and maximum trace lengths.

For each IC, the package delay for each signal is obtained, as indicated by block 31. Each pin of the IC corresponds to a particular signal. The package delay relates to the length of the trace that connects the die of the IC to the corresponding pin of the IC. The files 21 contain information that describes the IC package delays $T_{PKG}$ for each signal. The information contained in the files 21 may be gathered in a number of ways, as will be understood by those skilled in the art. The information may be obtained from the IC designer or it may be derived from information obtained from the IC designer and/or from the IC design specifications. Those skilled in the art will understand the manner in which such information may be gathered and placed in a form that is suitable for processing by the computer 20. The present invention is not limited with respect to the manner in which the files are generated and/or inputted into the computer 20.

Once the signal package delays for each of the ICs have been obtained, the combined package delays for each signal are calculated. For example, the package delay associated with signal A in IC 1 will be combined with the package delay associated with signal A in IC 2. This calculation will be performed for all signals. Next, the minimum and maximum pad-to-pad flight times as a function of the clock offset for all signals will be calculated, as indicated by block 33. The aforementioned known timing parameters and setup and hold equations are also used in this calculation. Those skilled in the art will understand how this calculation can be performed using these timing parameters, the setup and hold equations and the longest combined package delay.

Once the minimum and maximum pad-to-pad flight times have been determined as a function of the clock offset, the package delay, $T_{PKG}$, for each signal is subtracted from the corresponding flight time, $T_{FLIGHT}$, for each signal to obtain the board delay, $T_{BOARD}$, for each signal. The board delay is the time that a signal takes to travel from the driver pin of one IC to the corresponding receiver pin of another IC. The board delays are converted into distance by applying a flight time conversion to obtain the minimum and maximum trace lengths for each signal. These calculations are represented by block 34. The clock offset is then adjusted to maximize the difference between the smallest minimum trace length and the largest maximum trace length, as indicated by block 35. The manner in which this is accomplished will be discussed in more detail with respect to the timing diagrams of FIGS. 4 and 5.

The IC packages are then positioned and the signals routed so that the trace lengths fall between the minimum and maximum trace lengths, as indicated by block 36. Step 36 preferably is not physically performed, but rather, is performed by the PCB designer using a computer aided design program (CAD) program. Therefore, the computer 20 may import a file 21 generated by the CAD program that contains all of the routing information. The computer 20 then uses this information to calculate an adjusted clock offset that does not result in a violation of the setup time specifications and that results in the fewest possible violations of the hold time specification, as indicated by block 39.

Prior to determining the adjusted clock offset, the trace lengths computed in step 36 are compared to the smallest minimum and the largest maximum trace lengths to determine whether they are within the acceptable range computed during step 35. This is also performed in step 39, although not explicitly stated in the flow chart. If any of the trace lengths are not within the acceptable range, they are shortened or lengthened just enough so that they are within the acceptable range prior to calculating the adjusted clock offset. If any signal violates the hold time specification after the adjustment to the clock offset has been made, those traces associated with those signals are lengthened as indicated by block 40.

In accordance with the present invention, it has been determined that, given a particular clock offset, the board trace lengths can be adjusted without violating the setup or hold times of ICs communicating with each other. The manner in which this can be accomplished will be understood by those skilled in the art in view of the discussion of FIGS. 1A-3. Nevertheless, for demonstrative purposes, the manner in which the trace lengths can be adjusted without violating the setup time specifications will now be described with reference to FIGS. 4 and 5.

Figure 4:
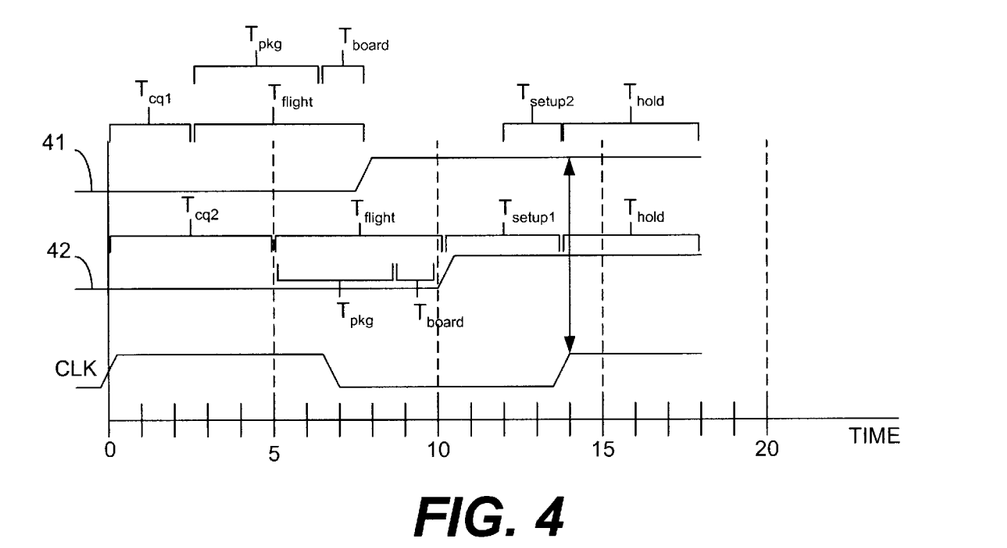
FIG. 4 is a timing diagram illustrating the timing of signals transmitted between the ICs shown in FIGS. 1A and 1B before an offset has been inserted in the global clock of the PCB bus.

FIG. 4 is a timing diagram that illustrates the timing of signals being transmitted between two ICs, such as ICs 1 and 2 shown in FIGS. 1A and 1B, and the timing of the PCB bus global clock signal, which has not been offset. The timing diagram will be discussed with reference to FIGS. 1A and 1B. The vertical axis corresponds to the magnitude of the signals in volts and the horizontal axis corresponds to time in nanoseconds (ns). The time units used are not necessarily accurate and are used merely to demonstrate the principles of the present invention. Also, the relative timing of the signals is not necessarily accurate, but is being used to illustrate the manner in which the setup margins can be optimized.

The signal 41 corresponds to a signal transmitted from IC 1 to IC 2. The signal 42 corresponds to a signal transmitted from IC 2 to IC 1. The signal CLK is the global clock signal of the PCB bus. The time $T_{cq1}$ is the clock-to-Q time associated with IC 1. The time $T_{cq2}$ is the clock-to-Q time associated with IC 2. The time $T_{flight}$ is the amount of time that it takes for a signal to travel from the driver pad of one of the ICs over the PCB bus to the receiver pad of the other IC. The time $T_{hold}$ is the hold time for ICs 1 and 2, which are shown as being equal, but this is not necessarily required.

The time $T_{cq1}$ can be added to the flight time $T_{flight}$ to obtain the total amount of time that is required from the time that the clock signal CLK arrives at IC 1 for the signal 41 to be received at the receiver pad of IC 2. As shown in FIG. 4, the time $T_{flight}$ is equal to the sum of the combined package delay, $T_{pkg}$, and the time delay required for the signal to travel from the driver pin of one IC to the receiver pin of another IC, $T_{board}$. The instant at which the signal 41 arrives at the receiver pad of IC 2 is represented by the transition in the signal 41 from low to high. The signal 41 arrives at the receiver pad at 8 nanoseconds (ns). The setup time for IC 2 begins 2 ns before the clock signal goes high again, which corresponds to 12 ns on the horizontal axis. Therefore, a setup margin of 4 ns exists for IC 2. In other words, the signal 41 is available at the receiver pad 4 ns before it must be available at the receiver pad.

In contrast, IC 2 has a longer $T_{cq2}$ than IC 1. Consequently, the signal is available at the receiver pad of IC 1 only approximately 4 ns before the clock signal goes high again. Also, the setup time for IC 1 is greater than the setup time for IC 2. Therefore, IC 1 has no setup margin. In other words, the signal 42 arrives at the receiver pad of IC 1 precisely when it must arrive in order to avoid violating the setup time of IC 1. Since the IC 1 has no setup margin, the trace length associated with the board delay $T_{board}$ cannot be lengthened without violating the setup time of IC 1.

Figure 5:
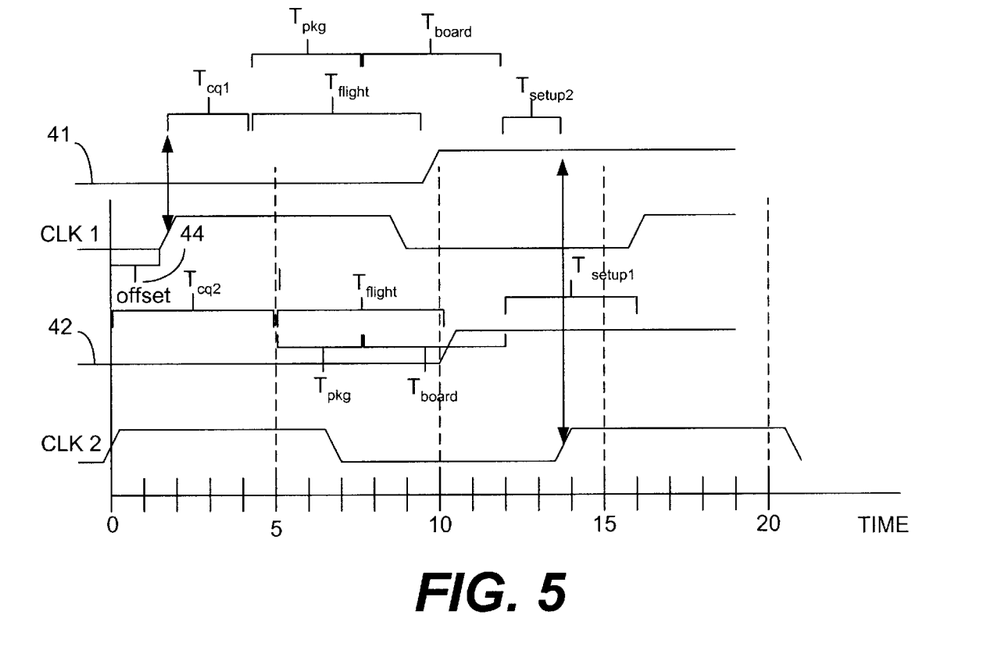
FIG. 5 is a timing diagram illustrating the timing of signals transmitted between the ICs shown in FIGS. 1A and 1B after an offset has been inserted in the global clock of the PCB bus to optimize the setup margins of the ICs.

The timing diagram of FIG. 5 demonstrates the manner in which the trace length can be increased without violating the setup time of IC 1. The signals shown in FIG. 5 are the same as the signals shown in FIG. 4 except that an additional clock signal CLK 1 is shown, which is the clock signal received by IC 1. The clock signal CLK 2 shown in FIG. 5 corresponds to the clock signal CLK shown in FIG. 4, which correspond to the global clock signal of the PCB bus. The clock signal CLK 2 is derived from the global clock and is delivered to IC 2, but has an offset 44 inserted therein. In this case, the offset corresponds to a delay of the global clock signal. However, the offset could instead correspond to a forward shift in time of the global clock signal.

By delaying the clock signal, the setup margin of IC 2 is decreased to 2 ns because the signal 41 arrives at the receiver pad of IC 2 at 10 ns and it must be present at the receiver pad of IC 2 at 12 ns, or 2 ns before the clock signal CLK 2 is delivered to IC 2. However, the signal 42 being delivered to IC 1 is now received at the receiver pad of IC 1 before it must be present at the receiver pad of IC 1. This enables the trace length to be increased, thereby increasing the board delay $T_{board}$ without violating the setup time specification of either IC 1 or IC 2. Thus, the trace length can be maximized without violating the setup time specifications of the ICs.

Figure 6:
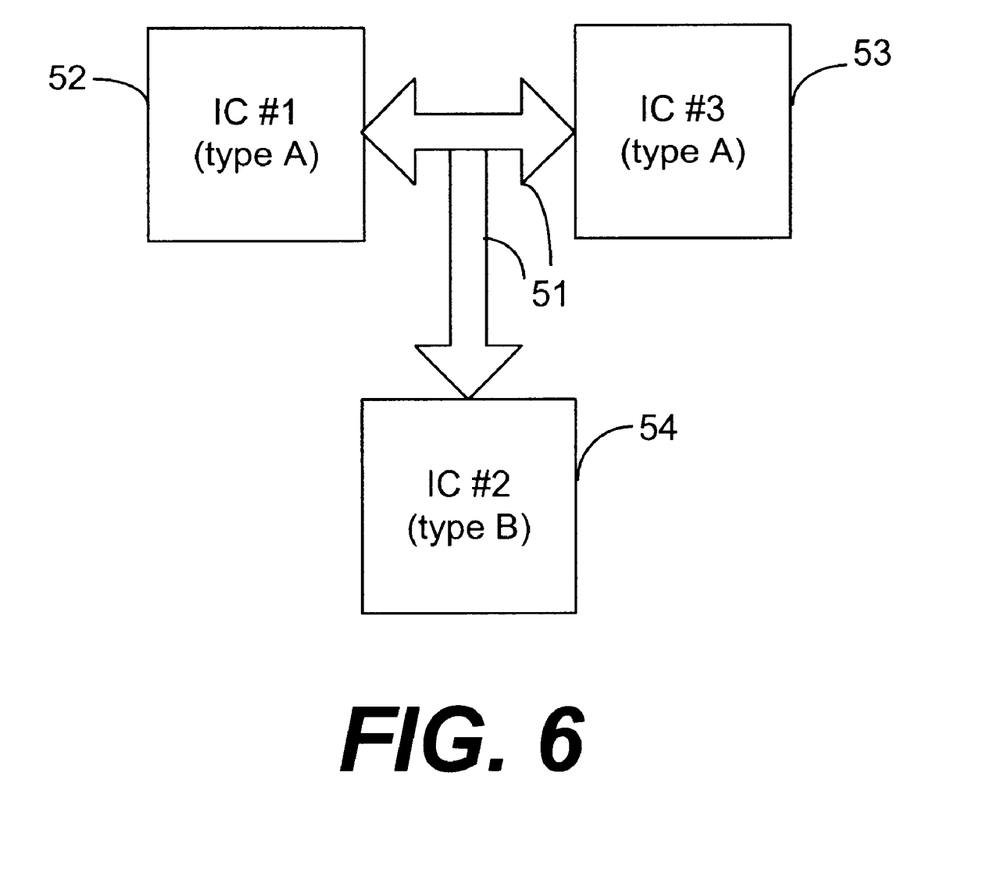
FIG. 6 is a block diagram of three ICs that are in communication with each other via a bus of a printed circuit board (PCB).
Figure 7:
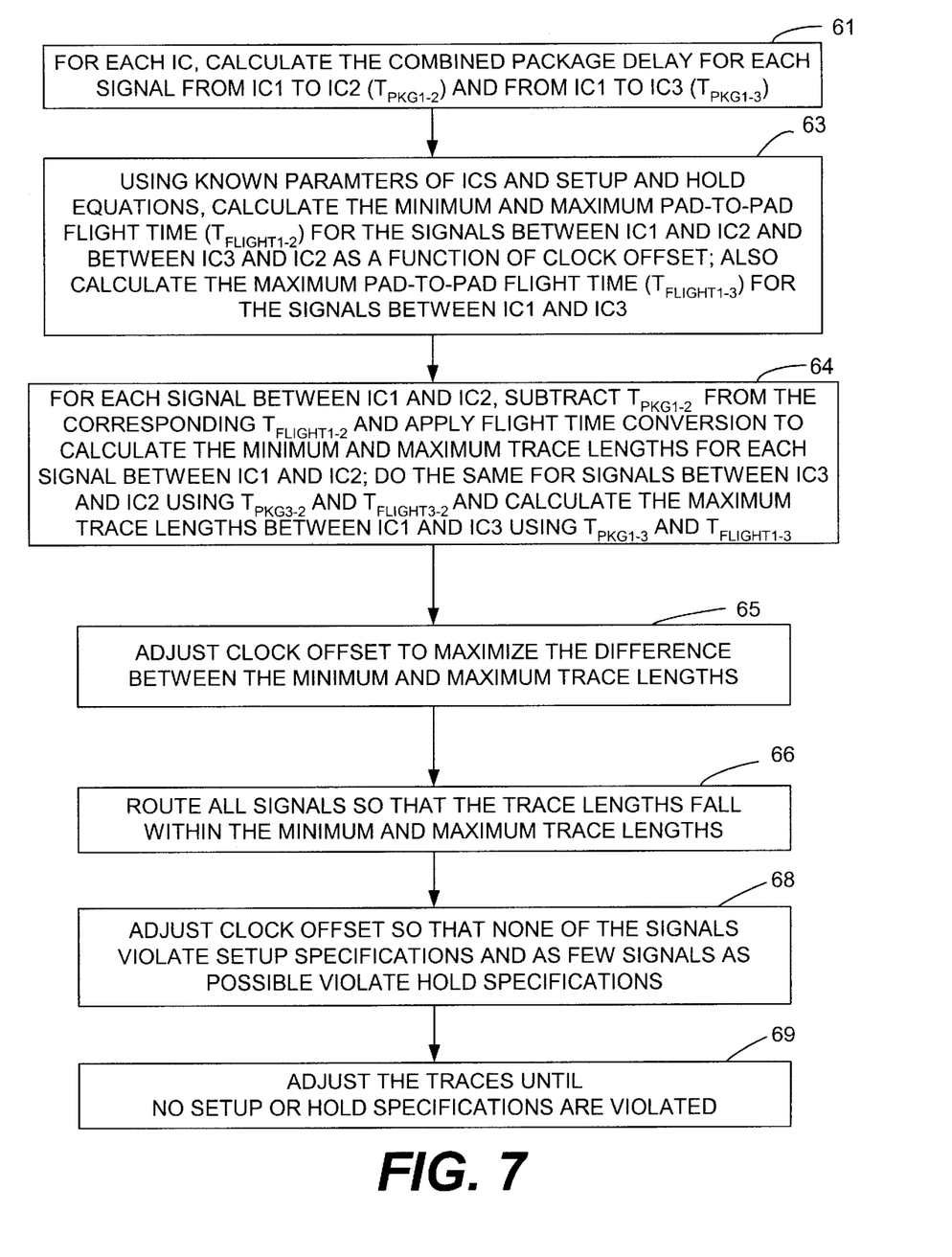
FIG. 7 is a flow chart illustrating the method of the present invention in accordance with a second embodiment.

FIG. 6 is a block diagram of three ICs that are in communication with each other via the PCB bus 51. Two of the ICs, namely ICs 52 and 53, are identical, at least in terms of their timing parameters (i.e., setup and hold times, clock-to-Q time and package delay) and pinout. IC 54 is different from the ICs 52 and 53, at least in terms of the aforementioned timing parameters. FIG. 7 is a flow chart illustrating the manner in which a second embodiment of the present invention can be used to optimize the PCB bus when such an arrangement of ICs must be considered. For ease of discussion, the ICs 52, 53 and 54 will be referred to as IC #s 1, 3 and 2, respectively. Therefore, IC #s 1 and 3 are the same and IC #2 is different.

The steps are very similar to those shown in FIG. 3, except that they have been varied to take into account a third IC. For each IC, the package delay for each signal is obtained, as indicated by block 61. As stated above, the package delay is the length of the trace that connects the die of an IC to the corresponding pin of that IC. Once the signal package delays for each of the ICs have been obtained, the combined package delays for each signal are calculated Next, the minimum and maximum pad-to-pad flight times as a function of the clock offset for all signals between ICs 1 and 2, are calculated as indicated by block 63. The maximum pad-to-pad flight times are also calculated for signals between ICs 1 and 3. Since there is no clock offset between ICs 1 and 3, there is no need to calculate the minimum pad-to-pad flight times. The aforementioned known timing parameters and setup and hold equations are also used in this calculation.

Once the minimum and maximum pad-to-pad flight times have been determined as a function of the clock offset, the package delay, $T_{PKG}$, for each signal is subtracted from the corresponding flight time, $T_{FLIGHT}$, for each signal to obtain the board delay, $T_{BOARD}$, for each signal between ICs 1 and 2 and between ICs 3 and 2. This same technique is used to calculate the maximum trace lengths between ICs 1 and 3. As stated above, the board delay is the time that a signal takes to travel from the driver pin of one IC to the corresponding receiver pin of another IC. The board delays are converted into distance by applying a flight time conversion to obtain the minimum and maximum trace lengths. These calculations are represented by block 64. The clock offset between ICs 1 and 2 and between ICs 3 and 2 is then adjusted to maximize the difference between the smallest minimum trace length and the largest maximum trace length, as indicated by block 65.

The IC packages are then positioned and the signals routed so that the trace lengths fall between the minimum and maximum trace lengths, as indicated by block 66. An adjusted clock offset is then calculated that does not result in a violation of the setup time specifications (maximum length) and that results in the fewest possible violations of the hold time specification (minimum length), as indicated by block 68. If the hold time specification is violated by any signal, the corresponding trace length will be increased.

Prior to determining the adjusted clock offset, the trace lengths computed in step 66 are compared to the smallest minimum and the largest maximum trace lengths between all of the ICs to determine whether they are within the acceptable range computed during step 64. This is also part of step 68, although not explicitly stated in the flow chart. If any of the trace lengths are not within the acceptable range, they are shortened or lengthened just enough so that they are within the acceptable range prior to calculating the adjusted clock offset. If any trace length is greater than the largest maximum IC 1 to IC 3 trace length, the ICs will need to be repositioned. If any signal violates the hold time specification after the adjustment to the clock offset has been made, the trace is lengthened, as indicated by block 69.

It should be noted that the present invention has been described with respect to the preferred embodiments of the present invention and that the present invention is not limited to these embodiments. It will be understood that modifications can be made to the present invention that are within the scope of the present invention.

What is claimed is:

1. An apparatus for designing conductive traces on a mounting surface adapted for mounting at least first and second integrated circuits (ICs) thereon, the apparatus comprising:

logic configured to determine a package delay for each signal;

logic configured to determine minimum and maximum pad-to-pad flight times of the signals between the ICs as a function of a clock offset;

logic configured to determine minimum and maximum trace lengths associated with the minimum and maximum pad-to-pad flight times, respectively;

logic configured to determine an adjusted clock offset that maximizes the difference between the minimum and maximum trace lengths; and logic configured to simulate the positioning of the ICs and the routing of the conductive traces such that none of the conductive traces allow setup or hold time specifications associated with the ICs to be violated.

2. The apparatus of claim 1, wherein the logic configured to determine the package delay, the logic configured to determine the minimum and the maximum pad-to-pad flight times, the logic configured to determine the minimum and maximum trace lengths, the logic configured to determine the adjusted clock offset, and the logic configured to simulate the positioning of the ICs and the routing of the conductive traces are comprised by a computer programmed with software for performing the tasks associated with each such logic.

3. The apparatus of claim 2, wherein the mounting surface is a printed circuit board (PCB).

4. The apparatus of claim 1, wherein the logic configured to simulate the positioning of the ICs and the routing of the conductive traces adjusts the clock offset, if necessary, after the simulation has been performed to ensure that no setup time specifications are violated and to ensure that as few as possible hold time specifications are violated, wherein if any hold time specifications are violated, the logic configured to simulate the positioning of the ICs and the routing of the conductive traces simulates adjusting the routing and lengths of the conductive traces until no setup or hold time specifications are violated.

5. An apparatus for designing conductive traces on a mounting surface adapted for mounting at least first, second and third integrated circuits (ICs) thereon, the apparatus comprising:

logic configured to determine a package delay for each signal;

logic configured to determine minimum and maximum pad-to-pad flight times of signals between certain ones of the ICs as a function of a clock offset;

logic configured to determine minimum and maximum trace lengths associated with the minimum and maximum pad-to-pad flight times, respectively;

logic configured to determine an adjusted clock offset that maximizes the difference between the minimum and maximum trace lengths; and logic configured to simulate the positioning of the ICs and the routing of the conductive traces such that none of the conductive traces allow setup or hold time specifications associated with the ICs to be violated.

6. The apparatus of claim 5, wherein the logic configured to determine the package delay, the logic configured to determine the minimum and maximum pad-to-pad flight times, the logic configured to determine the minimum and maximum trace lengths, the logic configured to determine the adjusted clock offset, and the logic configured to simulate the positioning of the ICs and the routing of the conductive traces are comprised by a computer programmed with software for performing the tasks associated with each such logic.

7. The apparatus of claim 6, wherein the mounting surface is a printed circuit board (PCB).

8. The apparatus of claim 5, wherein the logic configured to simulate the positioning of the ICs and the routing of the conductive traces adjusts the clock offset, if necessary, after the simulation has been performed to ensure that no setup time specifications are violated and to ensure that as few as possible hold time specifications are violated, wherein if any hold time specifications are violated the logic configured to simulate the positioning of the ICs and the routing of the conductive traces simulates adjusting the routing and lengths of the conductive traces until no setup or hold time specifications are violated.

9. A method for designing conductive traces on a mounting surface adapted for mounting at least first and second integrated circuits (ICs) thereon, the method comprising the steps of:

determining a package delay associated with each signal;
determining minimum and maximum pad-to-pad flight times of the signals between the ICs as a function of a clock offset;
determining minimum and maximum trace lengths associated with the minimum and maximum pad-to-pad flight times, respectively;
determining an adjusted clock offset that maximizes the difference between the minimum and maximum trace lengths; and
simulating the positioning of the ICs and the routing of the conductive traces such that none of the conductive traces allow setup or hold time specifications associated with the ICs to be violated.

10. The method of claim 9, wherein the steps of the method are performed by a computer programmed with software for performing the tasks associated with the steps.

11. The method of claim 10, wherein the mounting surface is a printed circuit board (PCB).

12. The method of claim 9, wherein the simulating step includes the step of adjusting the clock offset, if necessary, after the simulation has been performed to ensure that no setup time specifications are violated and to ensure that as few as possible hold time specifications are violated, wherein if any hold time specifications are violated the routing and lengths of the conductive traces are adjusted until no setup or hold time specifications are violated.

13. A method for designing conductive traces on a mounting surface adapted for mounting at least first, second and third integrated circuits (ICs) thereon, the method comprising the steps of:
determining a package delay associated with each signal;
determining minimum and maximum pad-to-pad flight times of the signals between the first and second ICs and to determine the maximum pad-to-pad flight times between the first and third ICs as a function of a clock offset;
determining minimum and maximum trace lengths associated with the minimum and maximum pad-to-pad flight times, respectively;
determining an adjusted clock offset that maximizes the difference between the minimum and maximum trace lengths; and
simulating the positioning of the ICs and the routing of the conductive traces such that none of the conductive traces allow setup or hold time specifications associated with the ICs to be violated.

14. The method of claim 13, wherein the steps of the method are performed by a computer programmed with software for performing the tasks associated with the steps.

15. The method of claim 14, wherein the mounting surface is a printed circuit board (PCB).

16. The method of claim 13, wherein the simulating step includes the step of adjusting the clock offset, if necessary, after the simulation has been performed to ensure that no setup time specifications are violated and to ensure that as few as possible hold time specifications are violated, wherein if any hold time specifications are violated the routing and lengths of the conductive traces are adjusted until no setup or hold time specifications are violated.

17. A computer program for designing conductive traces on a mounting surface adapted for mounting at least first and second integrated circuits (ICs) thereon, the computer program being embodied on a computer readable medium, the computer program comprising:
a code segment that determines a package delay associated with each signal;
a code segment that determines minimum and maximum pad-to-pad flight times between the ICs as a function of a clock offset;
a code segment that determines minimum and maximum trace lengths associated with the minimum and maximum pad-to-pad flight times, respectively;
a code segment that determines an adjusted clock offset that maximizes the difference between the minimum and maximum trace lengths; and
a code segment that simulates the positioning of the ICs and the routing of the conductive traces such that none of the setup or hold time specifications associated with the ICs to be violated.

18. The computer program of claim 17, wherein the code segment that simulates the positioning of the ICs and the routing of the conductive traces simulates adjustment of the clock offset, if necessary, after the routing and positioning simulation has been performed to ensure that no setup time specifications are violated and to ensure that as few as possible hold time specifications are violated, wherein if any hold time specifications are violated the code segment that simulates the positioning of the ICs and the routing of the conductive traces simulates adjusting the routing and lengths of the conductive traces until no setup or hold time specifications are violated.

19. A computer program for designing conductive traces on a mounting surface adapted for mounting at least first, second and third integrated circuits (ICs) thereon, the computer program being embodied on a computer readable medium, the computer program comprising:
a code segment that determines a package delay associated with each signal;
a code segment that determines minimum and maximum pad-to-pad flight times between the ICs as a function of a clock offset;
a code segment that determines -minimum and maximum trace lengths associated with the minimum and maximum pad-to-pad flight times, respectively;
a code segment that determines an adjusted clock offset that maximizes the difference between the minimum and maximum trace lengths; and
a code segment that simulates positioning of the ICs and routing of the conductive traces such that none of the conductive traces allow setup or hold time specifications associated with the ICs to be violated.

20. The computer program of claim 19, wherein the code segment that simulates the positioning of the ICs and the routing of the conductive traces simulates, if necessary, adjustment of the clock offset after the routing and position simulation has been performed to ensure that no setup time specifications are violated and to ensure that as few as possible hold time specifications are violated, wherein if any hold time specifications are violated the code segment that simulates the positioning of the ICs and the routing of the conductive traces simulates adjusting the routing and lengths of the conductive traces until no setup or hold time specifications are violated.

21. An apparatus for designing conductive traces on a mounting surface adapted for mounting at least a first and second integrated circuit (ICs) thereon, the apparatus comprising:
logic configured to calculate a range of pad-to-pad flight times for each signal between the first and second ICs;
logic configured to calculate a range of trace lengths for the signals corresponding to the range of pad-to-pad flight times;

logic configured to calculate a clock offset based on the difference between at least two of the trace lengths within the range of trace lengths; and logic configured to simulate the positioning of the ICs and the routing of the conductive traces such that none of the conductive traces allow setup or hold times to be violated.

22. The apparatus of claim 21, wherein the logic configured to calculate a range of trace lengths for the signals corresponding to the range of pad-to-pad flight times is further configured to calculate a range of board delays for the signals corresponding to the range of pad-to-pad flight times and convert the board delays to the range of trace lengths with a flight time conversion.

23. A method for designing conductive traces on a mounting surface adapted for mounting at least a first and second IC thereon, the method comprising the steps of:

calculating a range of pad-to-pad flight times for each signal between the first and second ICs;

calculating a range of trace lengths for the signals corresponding to the range of pad-to-pad flight times;

calculating a clock offset based on the difference between at least two of the trace lengths within the range of trace lengths; and simulating the positioning of the ICs and the routing of the conductive traces such that none of the conductive traces allow setup or hold times to be violated.

24. The method of claim 23, wherein the step of calculating a range of trace lengths further comprises the steps of:

calculating a range of board delays for the signals corresponding to the range of pad-to-pad flight times; and converting the board delays to the range of trace lengths with a flight time conversion.

* * * * *